(12) United States Patent
Morita

(10) Patent No.: US 9,991,666 B2
(45) Date of Patent: Jun. 5, 2018

(54) SEMICONDUCTOR LASER DEVICE AND METHOD OF MANUFACTURING THE SEMICONDUCTOR LASER DEVICE

(71) Applicant: Mitsubishi Electric Corporation, Tokyo (JP)

(72) Inventor: Daisuke Morita, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days. days.

(21) Appl. No.: 14/931,208

(22) Filed: Nov. 3, 2015

(65) Prior Publication Data

US 2016/0285238 A1    Sep. 29, 2016

(30) Foreign Application Priority Data

Mar. 26, 2015    (JP) ................. 2015-063673

(51) Int. Cl.
| | |
|---|---|
| *H01S 5/00* | (2006.01) |
| *H01S 3/10* | (2006.01) |
| *H01S 5/02* | (2006.01) |
| *H01S 5/20* | (2006.01) |
| *H01S 5/12* | (2006.01) |
| *H01S 5/22* | (2006.01) |

(52) U.S. Cl.
CPC .............. *H01S 3/10* (2013.01); *H01S 5/0202* (2013.01); *H01S 5/2018* (2013.01); *H01S 5/12* (2013.01); *H01S 5/22* (2013.01); *H01S 2301/173* (2013.01); *H01S 2301/203* (2013.01)

(58) Field of Classification Search
CPC . H01S 5/2275; H01S 3/10; H01S 5/22; H01S 5/12; H01S 5/3013; H01S 2301/203; H01S 2301/173
See application file for complete search history.

(56) References Cited

U.S. PATENT DOCUMENTS

| | | | | |
|---|---|---|---|---|
| 6,028,875 | A * | 2/2000 | Knight .................. | B82Y 20/00 372/45.01 |
| 6,107,112 | A * | 8/2000 | Kito ...................... | B82Y 20/00 117/953 |
| 6,678,299 | B1 * | 1/2004 | Inaba .................... | H01S 5/227 372/45.01 |

(Continued)

FOREIGN PATENT DOCUMENTS

| | | |
|---|---|---|
| JP | H08-111563 A | 4/1996 |
| JP | 2003-046190 A | 2/2003 |

(Continued)

OTHER PUBLICATIONS

An Office Action; "Notification of Reasons for Refusal," mailed by the Japanese Patent Office dated Mar. 20, 2018, which corresponds to Japanese Patent Application No. 2015-063673 and is related to U.S. Appl. No. 14/931,208; with English translation.

*Primary Examiner* — Yuanda Zhang
(74) *Attorney, Agent, or Firm* — Studebaker & Brackett PC

(57) ABSTRACT

A semiconductor laser device includes a substrate, a buffer layer provided on an upper surface of the substrate and formed of InP, a laser element having a ridge structure formed above the buffer layer, and an epi intermediate layer formed of a compound semiconductor containing As and exposed to the outside.

4 Claims, 3 Drawing Sheets

(56) References Cited

U.S. PATENT DOCUMENTS

| | | | |
|---|---|---|---|
| 2002/0172248 A1* | 11/2002 | Kito | ........................ H01S 5/227 |
| | | | 372/46.01 |
| 2003/0021319 A1 | 1/2003 | Aoki | |
| 2007/0121692 A1* | 5/2007 | Kawakami | .............. H01S 5/227 |
| | | | 372/43.01 |
| 2009/0052487 A1* | 2/2009 | Yamamoto | .............. H01S 5/227 |
| | | | 372/45.011 |
| 2013/0329761 A1* | 12/2013 | Hashimoto | ........... H01S 5/3401 |
| | | | 372/45.012 |

FOREIGN PATENT DOCUMENTS

| | | |
|---|---|---|
| JP | 2003-051636 A | 2/2003 |
| JP | 2004-140141 A | 5/2004 |

\* cited by examiner

Comparative Example

SEMICONDUCTOR LASER DEVICE AND METHOD OF MANUFACTURING THE SEMICONDUCTOR LASER DEVICE

BACKGROUND OF THE INVENTION

Field of the Invention

The present invention relates to a semiconductor laser device provided, for example, for high-speed optical response use and to a method of manufacturing the semiconductor laser device.

Background Art

As a semiconductor laser device realizing high-speed optical response, distributed feedback (DFB) laser devices which are for short-distance transmission but which can be manufactured at a comparatively low cost are mainly being used. There is a demand for achieving an improvement in yield (an improvement in the number of theoretically effective chips from one wafer) of a semiconductor laser device by chip size shrinkage as well as a demand for achieving both realization of high-speed response by reducing the capacitance and an improvement in high-temperature characteristic (an improvement in heat dissipation effect) by securing an epi volume about an emission point. From the viewpoint of improving the yield, it is desirable to form a process mesa by dry etching.

In DFB laser devices used for high-speed response in the present circumstances, the resonator length, for example, is set as short as 200 microns or less in order to increase the relaxation-vibration frequency. Forming a process mesa by dry etching is indispensable to stabilization of the characteristics of a DFB laser device having a short resonator length.

Japanese Patent Laid-Open No. 2003-051636 discloses a method of manufacturing a GaN-based semiconductor laser device.

Individual semiconductor laser devices separated from each other are obtained by cleaving a group of semiconductor laser devices in a wafer state. Cleaving is breaking the substrate at boundary portions between a plurality of semiconductor laser devices called dicing streets or separating sections. There is a possibility of the substrate being broken at a portion other than the separating sections at the time of cleaving. In particular, in a case where grooves called process mesa grooves are formed on opposite sides of ridge structure, there is a problem that breakage can occur in portions reduced in thickness due to the process mesa grooves.

SUMMARY OF THE INVENTION

In view of the above-described problem, an object of the present invention is to provide a semiconductor laser device and a semiconductor laser device manufacturing method capable of dividing a substrate while preventing breakage of the substrate in portions reduced in thickness due to process mesa grooves.

The features and advantages of the present invention may be summarized as follows.

According to one aspect of the present invention, a semiconductor laser device includes a substrate, a buffer layer provided on an upper surface of the substrate and formed of InP, a laser element having a ridge structure formed above the buffer layer, and an epi intermediate layer formed of a compound semiconductor containing As and exposed to the outside.

According to another aspect of the present invention, a method of manufacturing a semiconductor laser device includes a buffer layer forming step of forming a buffer layer on an upper surface of a substrate, the buffer layer being formed of InP, an element forming step of forming a plurality of laser elements on the buffer layer, each laser element having a ridge structure, and a chip producing step of obtaining the laser elements in chip form by dividing the substrate along separating sections which are regions including boundaries between the plurality of laser elements as viewed in plan, wherein the buffer layer forming step or the element forming step includes forming in the separating sections an epi intermediate layer formed of a compound semiconductor containing As.

Other and further objects, features and advantages of the invention will appear more fully from the following description.

DETAILED DESCRIPTION OF THE PREFERRED EMBODIMENTS

Figure 1:
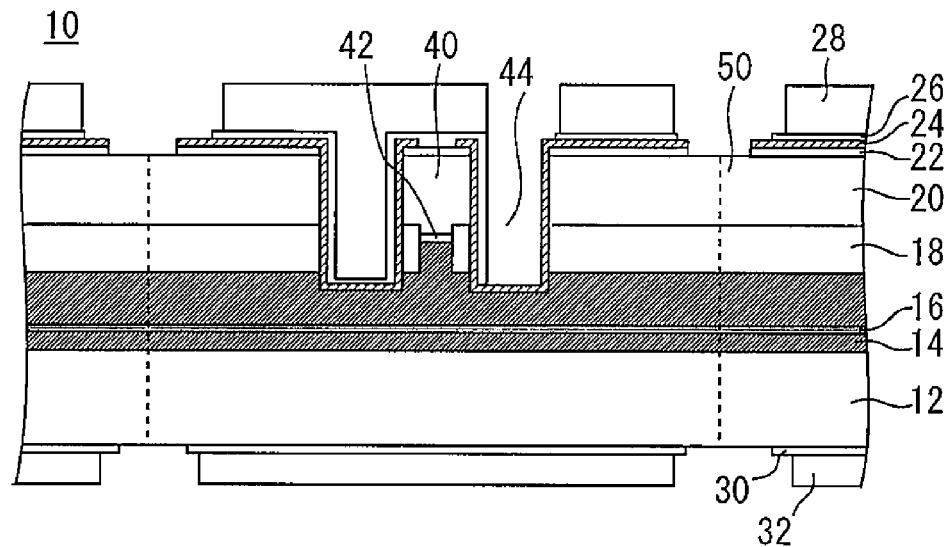
FIG. 1 is a sectional view of a semiconductor laser device in a wafer state.

A semiconductor laser device and a semiconductor laser device manufacturing method according to an embodiment of the present invention will be described with reference to the drawings. Components identical or corresponding to each other are assigned the same reference numerals. Repeated descriptions of them are avoided in some cases.

First Embodiment

FIG. 1 is a sectional view of a semiconductor laser device in a wafer state. This semiconductor laser device in a wafer state is divided along broken lines in the future. The semiconductor laser device has a substrate 12 formed of InP and a buffer layer 14 formed of InP provided on an upper surface of the substrate 12. The buffer layer 14 is partitioned into an upper portion and a lower portion by an epi intermediate layer 16 formed in the buffer layer 14.

The material of the epi intermediate layer 16 is a compound semiconductor containing As. For example, the material of the epi intermediate layer 16 is InGaAsP, AlGaInAs, AlInAs or InGaAs. These compound semiconductors can be easily lattice-matched to the buffer layer 14 formed of InP.

A plurality of laser elements having a ridge structure are formed above the buffer layer 14. Each laser element is, for example, a DFB laser element. The structure of the laser element will be described. A block layer 18 formed of InP is provided on the buffer layer 14. A cladding layer 20 formed of InP is provided on the block layer 18. A contact layer 22 formed of InGaAs is provided on the cladding layer 20. A feed metal 26 is formed on the contact layer 22 with a passivation film 24 formed of an insulating film interposed therebetween. The feed metal 26 is plated with Au plating 28. An active layer 42 is formed in the ridge structure 40. In the ridge structure 40, an opening is formed in the passivation film 24 to bring the contact layer 22 and the feed metal 26 into contact with each other.

At the boundaries between the plurality of laser elements, separating sections 50 on which cleavage for separating the individual laser elements one from another are provided. The separating sections 50 are regions including the boundaries between the plurality of laser elements as viewed in plan. The separating sections 50 extend generally parallel to the longitudinal direction of the ridge structures 40. The cladding layer 20 is exposed in upper surfaces of the separating sections 50. The substrate 12 is exposed in lower surfaces of the separating sections 50.

Journal of Material Science 23 (1988), 272-280 discloses the fact that when the proportion of As in the composition of an InGaAs-based material is increased, the Knoop strength (Knoop hardness) of the material is increased and the material becomes easily breakable even under a reduced load. The document also discloses the fact that because, as a result of an increase in proportion of As in the composition, the direction along which the material can break easily is changed so that microcracks can occur easily in the separating section, so that a state where the material is easily breakable even under a reduced load is established. Therefore, the epi intermediate layer 16 formed of a "compound semiconductor containing As" enables making the semiconductor laser device in the wafer state easily breakable in comparison with the case where the epi intermediate layer 16 does not exist.

If the layer thickness of the epi intermediate layer 16 is excessively large, the probability of occurrence and growth of an oblique crack at the time of cleavage is increased. Further, when the epi intermediate layer is made thicker, the Knoop strength is correspondingly increased and the probability of frequent occurrence of incomplete-separation failure is increased. From the viewpoint of inhibiting these faults, it is desirable to set the layer thickness of the epi intermediate layer 16 to a value equal to or smaller than 20 nm.

From the viewpoint of preventing degradation in laser characteristics due to provision of the epi intermediate layer 16, it is preferable to make sufficiently thick the buffer layer 14 above the epi intermediate layer 16 so that an active layer light intensity distribution reaching the epi intermediate layer 16 is reduced. For example, it is preferable to make the portion of the buffer layer 14 above the epi intermediate layer 16 sufficiently thick such that the light intensity distribution on the epi intermediate layer 16 is 10% or less.

As described above, the light intensity distribution on the epi intermediate layer 16 is reduced and a thin film material which can easily be lattice-matched to InP (e.g., InGaAsP, AlGaInAs, AlInAs or InGaAs) is used as epi intermediate layer 16, thus achieving good chip separability without degrading the laser element characteristics.

A method of manufacturing the semiconductor laser device according to the first embodiment of the present invention will subsequently be described. First, the buffer layer 14 including the epi intermediate layer 16 is formed on the upper surface of the substrate 12. This step is referred to as a buffer layer forming step.

Thereafter, a plurality of laser elements having the ridge structure are formed on the buffer layer 14. This step is referred to as an element forming step. In the element forming step, the active layer 42 is first grown to form the ridge (optical waveguide). Subsequently, the block layer 18, the cladding layer 20 and the contact layer 22 are formed in this order. Subsequently, process mesa grooves 44 are formed by a process of dry etching.

Subsequently, passivation film 24, feed metal 26 and Au plating 28 are formed. Subsequently, the substrate 12 is ground at the lower surface side to be reduced in thickness. Subsequently, feed metal 30 and plating 32 are formed.

Thereafter, a chip producing step for obtaining the plurality of laser elements in chip form is performed. In the chip producing step, each of scribed lines is formed by applying a scribing blade to the lower surface of one of the separating sections 50 in FIG. 1 (the lower surface of the substrate 12) and sliding the scribing blade, and the substrate (wafer) is thereafter divided along the separating sections 50. Since the wafer is made easily breakable by providing the epi intermediate layer 16, the substrate can be cleaved straight along the broken lines shown in FIG. 1. In the cross-section appearing as a result of dividing the wafer into pieces (chips), the epi intermediate layer 16 appears. That is, the epi intermediate layer 16 is exposed to the outside.

Figure 2:
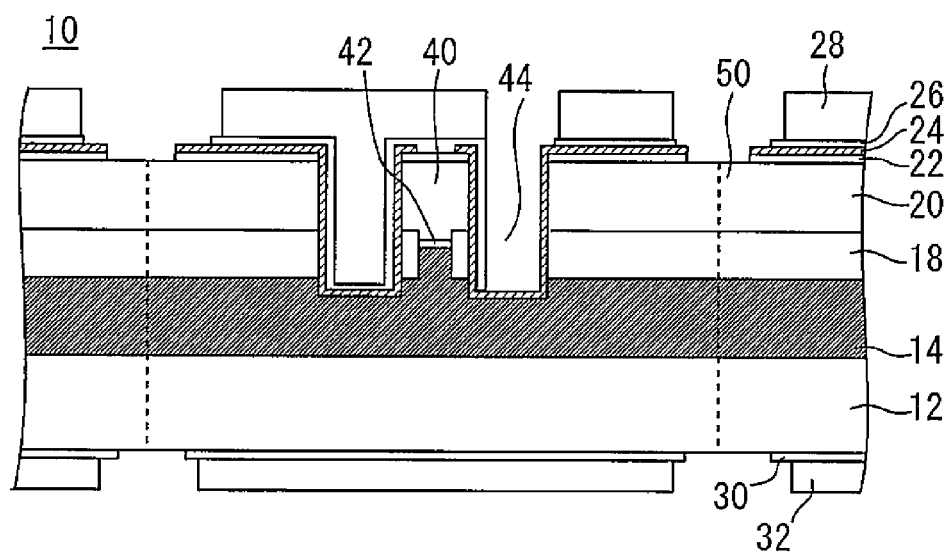
FIG. 2 is a sectional view of a semiconductor laser device according to a comparative example.

FIG. 2 is a sectional view of a semiconductor laser device according to a comparative example. This semiconductor laser device has no epi intermediate layer. The substrate cannot be broken under a small load unless an epi intermediate layer is provided. Therefore, there has been a possibility of application of a large load resulting in breakage of the wafer in portions reduced in thickness due to the process mesa grooves 44. In contrast, according to the invention set forth in Claim 1 in the present application, the epi intermediate layer 16 is provided to enable the substrate to be broken under a small load, thus avoiding the problem of breakage of portions reduced in thickness due to the process mesa grooves 44.

The semiconductor laser device and the semiconductor laser device manufacturing method according to the first embodiment of the present invention can be variously modified. For example, a semiconductor layer other than that shown in FIG. 1 may be provided. Semiconductor laser devices and semiconductor laser device manufacturing methods according to embodiments described below have a number of commonalities with the device and method according to the first embodiment and will therefore be described mainly with respect to points of difference from the first embodiment.

Second Embodiment

Figure 3:
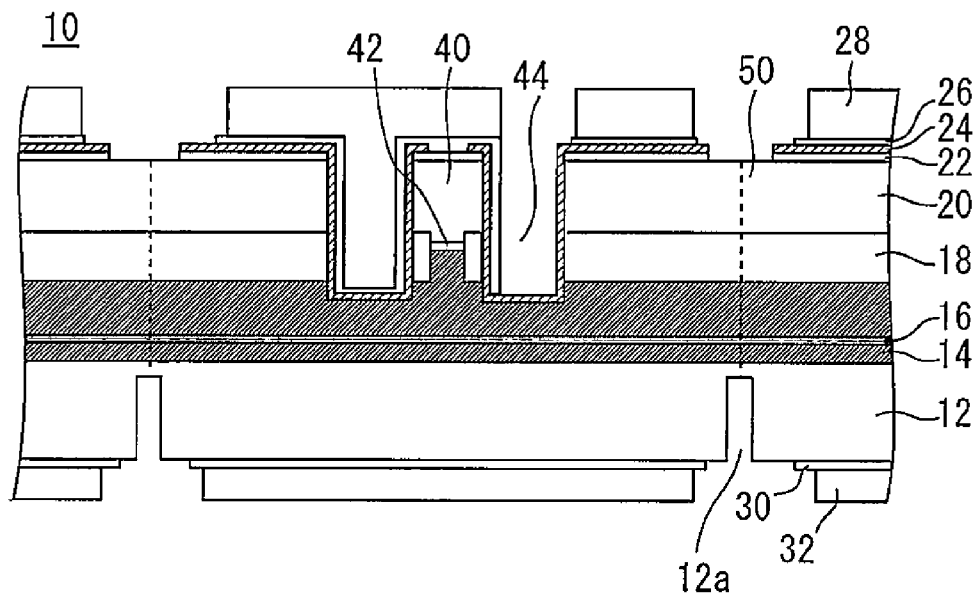
FIG. 3 is a sectional view of the semiconductor laser device in a wafer state according to the second embodiment.

FIG. 3 is a sectional view of the semiconductor laser device in a wafer state according to the second embodiment. Grooves 12a are formed in the lower surface of the substrate 12 in separating sections 50. Each groove 12a may be stitch grooves (grooves intermittently formed) or a continuous groove (a groove continuously formed). It is preferable that the grooves 12a have a width which allows a scribing blade to enter the groove, and which is about ⅙ of the chip width. The depth of the grooves 12a is not particularly specified if the grooves 12a do not reach the epi intermediate layer 16. The depth of the grooves 12a is, for example, several microns to several tens of microns.

It is desirable to form the grooves 12a by dry etching using a novolak-based negative resist mask or an insulating film hard mask capable of maintaining a high resist selectivity and using a kind of chlorine-based gas. The grooves 12a are formed before the chip producing step.

In the chip producing step, the substrate is cleaved along the grooves 12a. The provision of the grooves 12a along with the epi intermediate layer 16 enables individual semiconductor laser devices to be easily separated in the chip producing step. Thus, the substrate can be divided while breakage of the substrate in portions reduced in thickness due to the process mesa grooves 44 is prevented. Part of a peripheral portion of the substrate 12 of each separated individual semiconductor device is smaller in thickness than the portion surrounded by the peripheral portion by an amount corresponding to the formation of the groove 12a.

Third Embodiment

Figure 4:
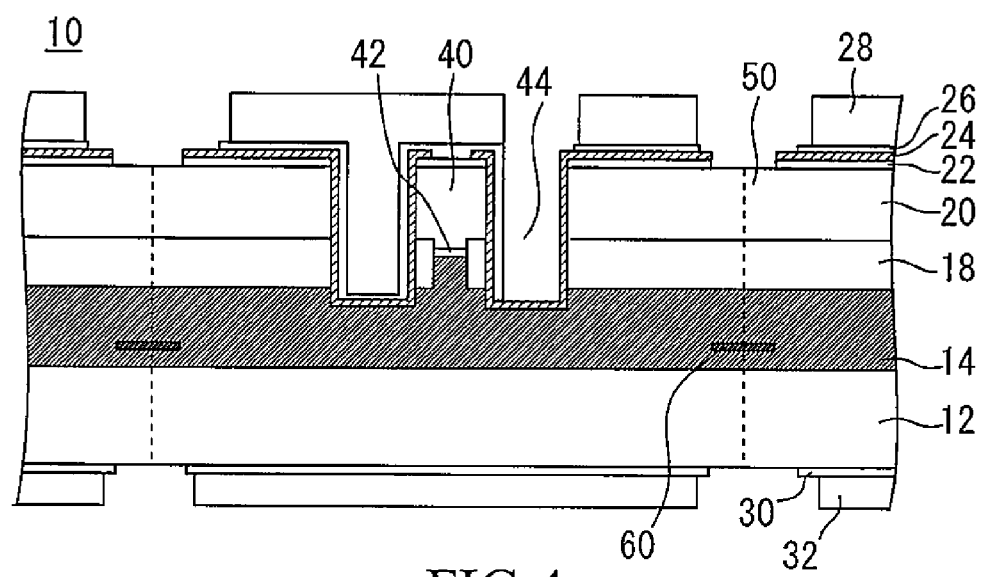
FIG. 4 is a sectional view of the semiconductor laser device in a wafer state according to the third embodiment.

FIG. 4 is a sectional view of the semiconductor laser device in a wafer state according to the third embodiment. An epi intermediate layer 60 is provided only in the separating sections 50 by avoiding positions right below the ridge structures 40. An epi intermediate layer is formed on the entire area of the buffer layer 14 and unnecessary portions thereof are thereafter removed by etching, thus obtaining the epi intermediate layer 60. Since the epi intermediate layer 60 is provided in each separating section 50, the substrate can easily be divided in the chip producing step.

In the first and second embodiments, the epi intermediate layer 16 is formed through the entire semiconductor device, therefore it is necessary to increase the thickness of the buffer layer 14 to such an extent that the epi intermediate layer 16 does not interfere with the distribution of the intensity of light from the active layer. Forming the thick buffer layer 14 requires a long epi growth time. In addition, in the case where the buffer layer 14 is thick, there is a possibility of occurrence of cracking in the portions reduced in thickness due to the process mesa grooves 44 before reaching the epi intermediate layer 16 from the separating scribing point at the time of chip separation. In the third embodiment of the present invention, however, the epi intermediate layer 60 is provided only in the separating sections 50. Prevention of expansion of the light intensity distribution on the epi intermediate layer 60 is thereby enabled without increasing the thickness of the buffer layer 14.

Figure 5:
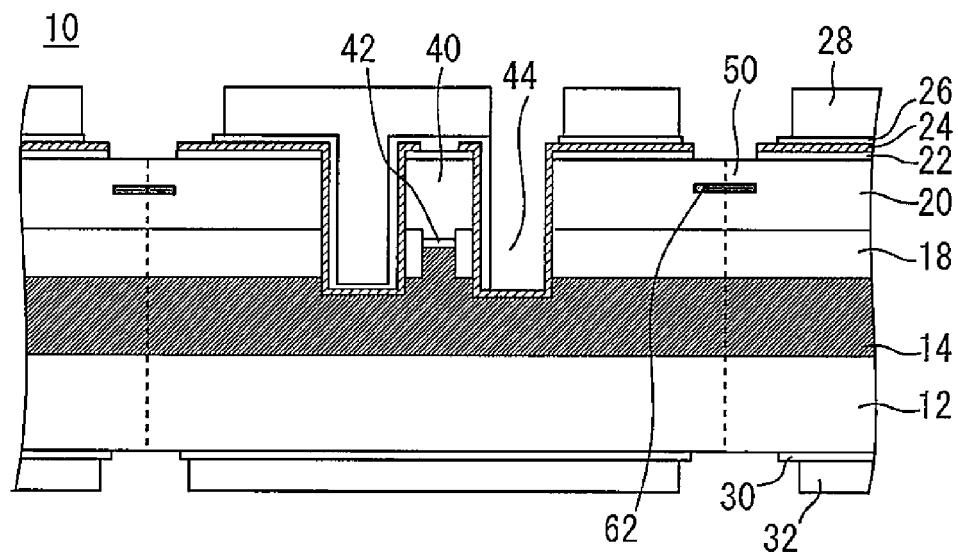
FIG. 5 shows a semiconductor laser device.

In a case where an epi intermediate layer is provided only in the separating sections 50, the epi intermediate layer can be provided in a place other than the place in the buffer layer 14. That is, the epi intermediate layer can be provided in an intermediate portion of the contact layer or in some other epi layer. FIG. 5 shows a semiconductor laser device in which an epi intermediate layer 62 is provided in the cladding layer 20 in the separating sections 50.

Thus, an epi intermediate layer can be provided at any position other than the intermediate position in the buffer layer. That is, an epi intermediate layer formed of a compound semiconductor material containing As can be formed in the separating sections 50 in the buffer layer forming step or the element forming step. Restrictions on products or the structure are thereby relaxed to ensure a higher degree of design flexibility. Also, because a certain degree of flexibility in terms of scribing load at the time of chip separation is obtained, the structure of the obtained semiconductor laser device can be stabilized. That is, the stability of chip separation can be improved.

Figure 6:
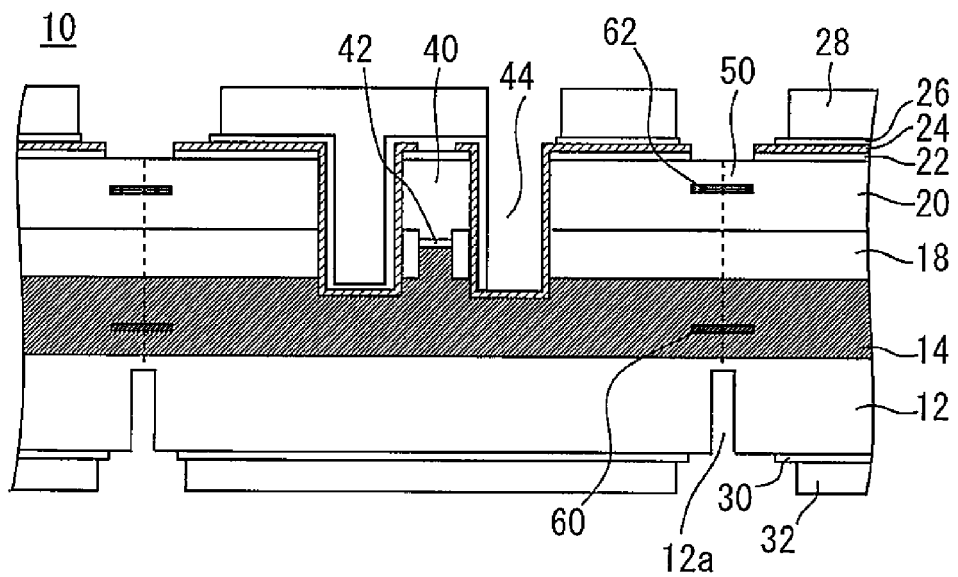
FIG. 6 is a sectional view of a semiconductor laser device in a wafer state according to a modified example.

FIG. 6 is a sectional view of a semiconductor laser device in a wafer state according to a modified example. Epi intermediate layers 60 and 62 are formed only in the separating sections 50, and grooves 12a are formed in the lower surface of the substrate 12. As a result, a further improvement in separation stability can be achieved. Furthermore, the features of each of the above-described embodiments may be combined and used as needed.

According to the present invention, an epi intermediate layer easy to break is provided at the boundaries between the semiconductor laser devices, thereby enabling dividing the substrate while preventing breakage of the substrate in portions reduced in thickness due to process mesa grooves.

Obviously many modifications and variations of the present invention are possible in the light of the above teachings. It is therefore to be understood that within the scope of the appended claims the invention may be practiced otherwise than as specifically described.

What is claimed is:

1. A semiconductor laser device comprising:
   a substrate;
   a buffer layer provided on an upper surface of the substrate and formed of InP;
   a laser element having a ridge structure formed above the buffer layer; and
   an epi intermediate layer formed of a compound semiconductor containing As and exposed to the outside of the device, wherein
   the entire epi intermediate layer is formed either within the buffer layer or does not vertically overlap with any portion of the ridge structure, and
   the layer thickness of the epi intermediate layer is equal to or smaller than 200 nm.

2. The semiconductor laser device according to claim 1, wherein part of a peripheral portion of the substrate is smaller in thickness than a portion surrounded by the peripheral portion.

3. The semiconductor laser device according to claim 1, wherein the epi intermediate layer is provided by avoiding a position right below the ridge structure.

4. A semiconductor laser device comprising:
   a substrate;
   a buffer layer provided on an upper surface of the substrate and formed of InP;
   a laser element having a ridge structure formed above the buffer layer; and
   an epi intermediate layer formed of a compound semiconductor containing As and exposed to the outside of the device,
   wherein the epi intermediate layer is formed either within the buffer layer or does not vertically overlap with the ridge structure,
   the epi intermediate layer is formed as an intermediate layer in the buffer layer, and
   a portion of the buffer layer above the epi intermediate layer is formed with a thickness such that a light intensity distribution from the epi intermediate layer is 10% or less.

* * * * *